United States Patent
Thomas et al.

(10) Patent No.: US 6,856,129 B2
(45) Date of Patent: Feb. 15, 2005

(54) CURRENT PROBE DEVICE HAVING AN INTEGRATED AMPLIFIER

(75) Inventors: Thomas P. Thomas, Beaverton, OR (US); Douglas N. Stunkard, Portland, OR (US); Miriam R. Reshotko, Portland, OR (US); Brandon C. Barnett, Beaverton, OR (US); Ian A. Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/190,712

(22) Filed: Jul. 9, 2002

(65) Prior Publication Data

US 2004/0008043 A1 Jan. 15, 2004

(51) Int. Cl.$^7$ .............................................. G01R 31/00
(52) U.S. Cl. ..................... 324/158.1; 324/765; 324/767
(58) Field of Search .................... 324/123 R, 126–127, 324/117 R, 454–457, 130, 73.1, 158.1; 250/214.1

(56) References Cited

U.S. PATENT DOCUMENTS

| | | | | |
|---|---|---|---|---|
| 4,646,005 A | * | 2/1987 | Ryan ...................... | 324/123 R |
| 4,673,885 A | * | 6/1987 | Lewiner et al. ............. | 324/457 |
| 4,709,141 A | * | 11/1987 | Olsen ...................... | 250/214.1 |
| 4,923,407 A | * | 5/1990 | Rice et al. ..................... | 439/92 |
| 5,012,186 A | | 4/1991 | Gleason | |
| 5,270,660 A | * | 12/1993 | Werner et al. .............. | 324/457 |
| 5,323,115 A | * | 6/1994 | Werner, Jr. .................. | 324/457 |
| 5,506,515 A | | 4/1996 | Godshalk et al. | |
| 5,565,788 A | | 10/1996 | Burr et al. | |
| 5,661,396 A | * | 8/1997 | Wissman ..................... | 324/127 |
| 5,699,530 A | | 12/1997 | Rust et al. | |
| 5,869,975 A | | 2/1999 | Strid et al. | |
| 5,963,058 A | | 10/1999 | Thomas | |
| 6,125,217 A | | 9/2000 | Paniccia et al. | |
| 6,140,883 A | | 10/2000 | Thomas | |
| 6,566,854 B1 | * | 5/2003 | Hagmann et al. ........ | 324/117 R |

FOREIGN PATENT DOCUMENTS

WO    0227298    4/2002

OTHER PUBLICATIONS

English Translation of WO 02/27298A1 (PCT/EP01/08778) 9 pages.

* cited by examiner

Primary Examiner—Vinh P. Nguyen
(74) Attorney, Agent, or Firm—Blakely, Sokoloff, Taylor & Zafman LLP

(57) ABSTRACT

A measurement system is provided that includes a probe device having an integrated amplifier. The integrated amplifier may be a transimpedence amplifier that amplifies input current to an output voltage.

26 Claims, 2 Drawing Sheets

CURRENT PROBE DEVICE HAVING AN INTEGRATED AMPLIFIER

FIELD

The present invention is directed to a high frequency probe device.

BACKGROUND

Probe assemblies may be operable at frequencies extending into the gigahertz range and capable of providing a transmission channel of well-defined impedance for the low loss transfer of signals to and from contact pads of a device under test (DUT). However, problems may occur during high frequency probing and testing of devices having a small output current.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example arrangements and embodiments of the invention, it should be clearly understood that the same is by way of illustration and example only and that the invention is not limited thereto.

The following represents brief descriptions of the drawings in which like reference numerals represent like elements and wherein.

DETAILED DESCRIPTION

Figure 1:
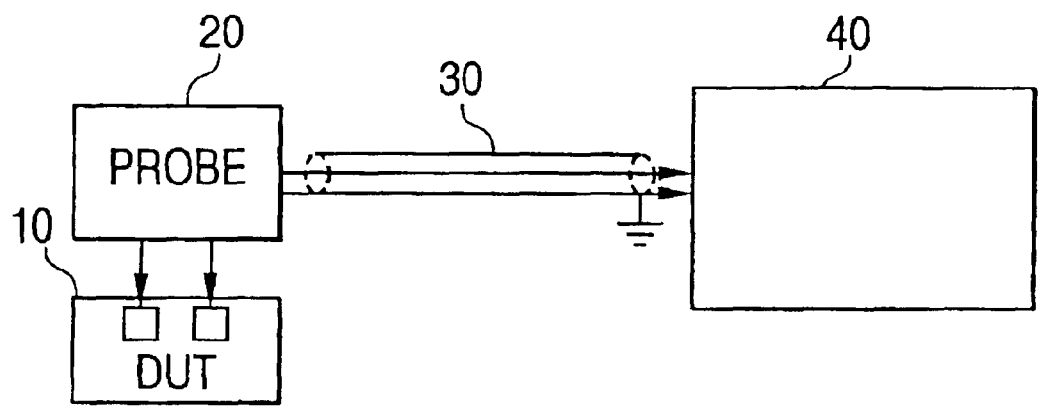
FIG. 1 illustrates a measurement system according to one example arrangement.

In the following detailed description, like reference numerals and characters may be used to designate identical, corresponding or similar components in differing figure drawings. Further, in the detailed description to follow, example values may be given, although the present invention is not limited to the same. Well known power/ground connections to components may not be shown within the FIGS. for simplicity of illustration and discussion, and so as not to obscure the invention. Where specific details (e.g., circuits) are set forth in order to describe example embodiments of the invention, it should be apparent to one skilled in the art that the invention can be practiced without, or with variation of, these specific details. Finally, it should be apparent that differing combinations of hard-wired circuitry may be used to implement embodiments of the present invention. That is, the present invention is not limited to any specific combination of hardware.

Embodiments of the present invention may relate to high frequency probing and testing of devices with current outputs such as photodiodes. In order to test components with a small output current, an amplifier may be used to drive the impedance of the transmission lines (i.e., cables) to test equipment, and to produce a signal large enough to be discernable on a low impedance, high frequency measurement device, such as a 50 ohm oscilloscope.

FIG. 1 illustrates a measurement system according to one example arrangement. Other arrangements are also possible. As shown in FIG. 1, a probe device 20 may be coupled to transmission lines 30 which in turn are coupled to test equipment 40, such as a 50 ohm oscilloscope. The probe device 20 may include more than one signal probe to contact a device under test (DUT) 10 and perform the desired testing and probing. In this arrangement, the DUT 10 may produce a current large enough to output a signal through the probe device 20, and along the transmission lines 30 to the test equipment 40. However, problems may occur if a large enough current is not output to the test equipment 40.

Figure 2:
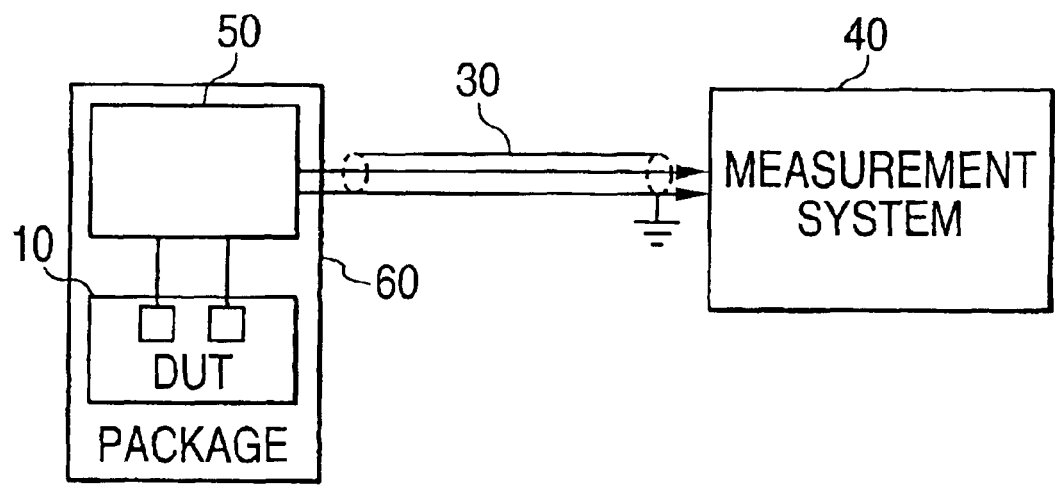
FIG. 2 illustrates a measurement system according to one example arrangement.

FIG. 2 illustrates a measurement system according to another example arrangement. Other arrangements are also possible. In this arrangement, a transimpedance amplifier (TIA) may be provided on a package 60 along with the DUT 10. The on-package transimpedance amplifier (TIA) 50 may be coupled to the transmission lines 30 and ultimately to the test equipment 40. However, in this arrangement, each package 60 may include a different transimpedance amplifier to produce the desired amplification. Over time, the test equipment 40 may be coupled to different packages and therefore different transimpedance amplifiers. Because different transimpedance amplifiers are used with the same test equipment 40, different readings may occur due to the different amplifiers. In other words, different amplification may occur on different packages. Wafer and die-level testing may not be possible since packaging is required.

Figure 3:
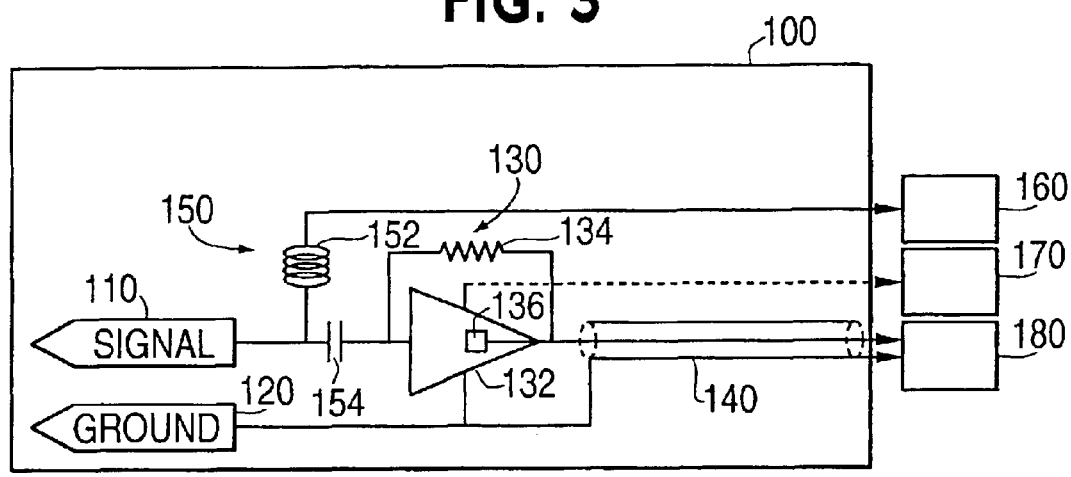
FIG. 3 illustrates a probe device according to an example embodiment of the present invention.

FIG. 3 illustrates a probe device 100 according to an example embodiment of the present invention. Other embodiments and configurations are also within the scope of the present invention. While FIG. 3 shows components within (or part of) the probe device 100 and outside of the probe device 100, certain components may be located external to the probe device 100 and/or internal to the probe device 100. More specifically, FIG. 3 shows the probe device 100 coupled to the test equipment 40 and to a DC power supply 160 and a DC power supply 170. While FIG. 3 shows the test equipment 40 and power supplies 160, 170 located external to the probe device 100, these and/or other components may also be considered part of the probe device 100.

The probe device 100 may measure current (including small current on the microamp scale) directly from the DUT 10 at a high frequency without packaging and without the external circuit components such as shown in FIGS. 1 and 2. In this embodiment, a transimpedence amplifier may be located substantially at the DUT 10 (by being integrated with the probe device 100). More specifically, embodiments of the present invention may provide a transimpedence amplifier close to the current output of the device under test 10. This may be accomplished by integrating the transimpedence amplifier into the probe device and thereby sensing small currents directly at the device (i.e., wafer) level without requiring packaging or any extra circuit components as in disadvantageous arrangements.

More specifically, the probe device 100 may include a transimpedence amplifier 130 that outputs signals along transmission line(s) 140 to the test equipment 40. In one example embodiment, the transmission line(s) may correspond to coaxial cable. The transmission line(s) 140 may or may not be considered part of the probe device 100. The transimpedance amplifier 130 may include an amplifier 132 and a feedback resistor 134 coupled between the output of the amplifier 132 and the input of the amplifier 132. The probe device 100 may also include a signal probe 110 and a ground probe 120 to contact the DUT 10. While FIG. 3 only shows two signal probes (or probe tips) to contact the DUT 10, embodiments of the present invention may also include three signal probes (such as a ground-signal-ground probe device) to contact the DUT 10.

The probe device 100 may also include a bias T component 150 integrated within the probe device 100 to separate the DC and AC components of the signals and to reduce parasitics of using an external bias T. The bias T component 150 may include an inductor 152 and a capacitor 154. The bias T component 150 may be coupled between the signal probe 110, for example, and the transimpedence amplifier 130. The inductor 152 may be coupled to a DC power supply 160 so as to provide an appropriate DC bias. A DC power supply 170 (which may be the same as or different than the DC power supply 160) may power the amplifier 132. In this embodiment, the DC power supply 160 and the DC power supply 170 are located external to the probe device 100. Embodiments of the present invention are also applicable to the DC power supply 160 and/or the DC power supply 170 being part of the probe device 100.

In operation, the transimpedance amplifier 130 amplifies the input current (from the DUT 10) to an output voltage on the transmission line(s) 140. The output voltage on the transmission line(s) 140 may be input to the test equipment 40 such as a 50 ohm oscilloscope. Other types of test equipment 40 are also within the scope of the present invention.

FIG. 3 illustrates a high frequency current probe device 100 according to an example embodiment of the present invention. The transimpedance amplifier 130 may be integrated into the high frequency ground-signal probe device 100 so as to amplify the input current to an output voltage. The transimpedence amplifier 130 may include an impedance matched output driver 136 that drives the output voltage signal through the transmission line(s) 140 to the test equipment 40. The bias T component 150 may be formed by the inductor 152 and the capacitor 154 so as to allow the DUT 10 to be biased independently. The power supply 170 may provide power to the amplifier 132. The power supply 170 may be decoupled close to the amplifier 132 with very low loop conductance. In another example embodiment of the present invention, an amplifier having a current gain may be used in place of the transimpedence amplifier 130. Other amplifiers are also within the scope of the present invention.

Figure 4:
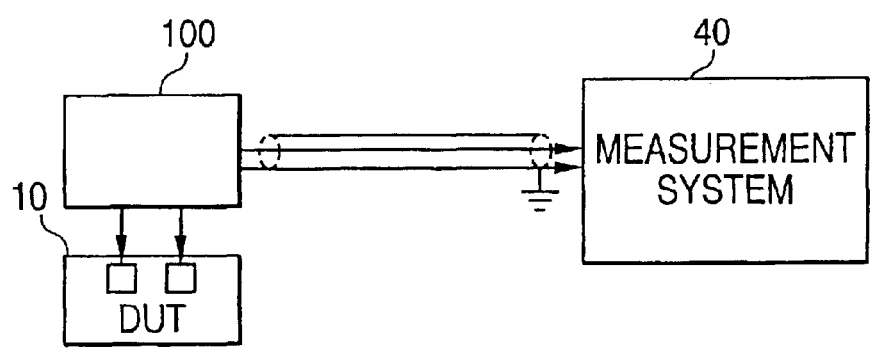
FIG. 4 illustrates a measurement system according to an example embodiment of the present invention.

FIG. 4 illustrates a measurement system according to an example embodiment of the present invention. Other embodiments and configurations are also within the scope of the present invention. The probe device 100 may be coupled to the transmission line(s) 140 and to the test equipment 40. As shown in this embodiment, the probe device 100 may contact the DUT 10 so as to receive a signal (or signals) indicative of the current. The probe device 100 may output a signal (or signals) along the transmission line(s) 140 to the test equipment 40. Other embodiments and configurations are also within the scope of the present invention.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A probe apparatus comprising:
    a first probe tip for contacting a device under test (DUT);
    a second probe tip for contacting the DUT;
    an integrated transimpedance amplifier coupled to the first probe tip and the second probe tip.

2. The probe apparatus of claim 1, wherein the first and second probe tips are for electrically contacting the DUT.

3. The probe apparatus of claim 2, wherein the DUT is a photodiode.

4. The probe apparatus of claim 1, wherein the first probe tip is a signal probe tip.

5. The probe apparatus of claim 4, wherein the second probe tip is a ground probe tip.

6. The probe apparatus of claim 1, wherein the transimpedance amplifier amplifies input current to an output voltage.

7. The probe apparatus of claim 6, wherein the integrated transimpedance amplifier comprises:
    a feed back resistor coupled between an output and an input of an amplifier.

8. The probe apparatus of claim 7, wherein the amplifier includes an output driver having an impedance substantially matching the impedance of a transmission line connected to the output of the amplifier.

9. The probe apparatus of claim 1, wherein the integrated transimpedance amplifier is coupled to the first probe tip by at least one bias T component.

10. The probe apparatus of claim 9, wherein the bias T component comprises:
    a capacitor coupled in series between the first probe tip and an input of the integrated transimpedance amplifier; and
    an inductor with a first and second end, wherein the first end is coupled between the capacitor and the first probe tip.

11. The probe apparatus of claim 10, wherein the first end of the inductor is coupled between the capacitor and the input of the transimpedance amplifier.

12. The probe apparatus of claim 10, wherein the second end of the inductor is coupled to a ground connection.

13. The probe apparatus of claim 10, wherein the second end of the inductor is coupled to a DC power supply.

14. A device comprising:
    a probe for contacting a device under test (DUT) having a first and second probe tip; and
    a bias T component coupled to at least the first probe tip and an integrated transimpedance amplifier.

15. The device of claim 14, wherein the bias T component comprises:
a capacitor coupled in series between the first probe tip and an input of the integrated transimpedance amplifier; and
an inductor with a first and second end, wherein the first end is coupled between the capacitor and the first probe tip.

16. The probe apparatus of claim 15, wherein the second end of the inductor is coupled to a DC power supply.

17. A method comprising:
contacting a device under test (DUT) with a first probe having a first and a second probe tip coupled to an integrated transimpedance amplifer;
sensing a current signal on the DUT;
amplifying the current signal with the integrated transimpedance amplifier; and
outputting a voltage signal from the transimpedance amplifier based on the current signal.

18. The method of claim 17, wherein the first probe tip contacts a signal on the DUT and the second probe tip contacts a ground contact on the DUT.

19. The method of claim 17, further comprising:
determining the sensed current using a measuring device based on the voltage signal from the transimpedance amplifier.

20. A system comprising:
a probe having a first and a second probe tip for contacting a device under test (DUT) and an integrated transimpedance amplifier, wherein the first probe tip is coupled to the transimpedance amplifier through a bias T component;
a transmission line with a first and a second end, wherein the first end of the transmission line is coupled to an output of the transimpedance amplifier; and
a measurement device coupled to the second end of the transmission line.

21. The system of claim 20, wherein the integrated transimpedance amplifier comprises:
a feed back resistor coupled between an output and an input of an amplifier.

22. The system of claim 20, wherein the bias T component comprises:
a capacitor coupled in series between the first probe tip and an input of the integrated transimpedance amplifier; and
an inductor with a first and second end, wherein the first end is coupled between the capacitor and the first probe tip.

23. The system of claim 22, wherein the second end of the inductor is coupled to a DC bias voltage supplied from a power supply.

24. The system of claim 20, wherein the transmission line is a coaxial cable.

25. The system of claim 20, wherein the measurement device is a oscilloscope.

26. The system of claim 20, wherein an impedance of an output driver in the transimpedance amplifier substantially matches an impedance of the transmission line.

* * * * *